United States Patent
Leycuras

(10) Patent No.: US 7,416,606 B2
(45) Date of Patent: Aug. 26, 2008

(54) METHOD OF FORMING A LAYER OF SILICON CARBIDE ON A SILICON WAFER

(75) Inventor: André Leycuras, Valbonne (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 10/555,559

(22) PCT Filed: May 5, 2004

(86) PCT No.: PCT/FR2004/001091

§ 371 (c)(1),
(2), (4) Date: Jun. 26, 2006

(87) PCT Pub. No.: WO2004/099471

PCT Pub. Date: Nov. 18, 2004

(65) Prior Publication Data

US 2007/0101928 A1    May 10, 2007

(30) Foreign Application Priority Data

May 5, 2003    (FR) .................................. 03 05453

(51) Int. Cl.
*C30B 25/12*    (2006.01)
*C30B 25/14*    (2006.01)
(52) U.S. Cl. ............................. 117/105; 117/89; 117/95
(58) Field of Classification Search .................. 117/95, 117/97, 105, 89
See application file for complete search history.

(56) References Cited

U.S. PATENT DOCUMENTS 6,416,578 B1    7/2002    Nakano et al.

FOREIGN PATENT DOCUMENTS

| EP | 1143033 | 10/2001 |
|---|---|---|
| JP | 62102908 | 4/1987 |
| JP | 62113153 | 5/1987 |
| JP | 62154098 | 6/1987 |
| JP | 63270398 | 11/1988 |
| JP | 63277596 | 11/1988 |
| JP | 63319294 | 12/1988 |
| JP | 08275133 | 10/1996 |
| JP | 10125905 | 5/1998 |

OTHER PUBLICATIONS

Pensl, et al., "Silicon Carbide and Related Materials", Proceedings of the 3rd European Conference on Silicon Carbide and Related Materials, Materials Science Forum vols. 353-356 (2001) pp. 155-158.
Pensl, et al. "Silicon Carbide and Related Materials," Proceedings of the 3rd European Conference on Silicon Carbide and Related Materials, Material Science Forum vols. 353-356 (2001) pp. 155-158.

*Primary Examiner*—Felisa C Hiteshew
(74) *Attorney, Agent, or Firm*—Howard IP Law Group, PC

(57) ABSTRACT

The invention relates to a method of forming a layer of silicon carbide on a silicone wafer. The method includes the following steps: depositing an anti-carburation mask on the wafer using an essentially-check pattern; performing a carburation step under conditions such that the residual stress takes the form of extension and compression respectively; removing the mask; and form of extension and compression respectively; removing the mask; and performing a carburation step under conditions such that the residual stress takes form of compression and extension respectively.

6 Claims, 1 Drawing Sheet

METHOD OF FORMING A LAYER OF SILICON CARBIDE ON A SILICON WAFER

CLAIM FOR PRIORITY

Figure 1:
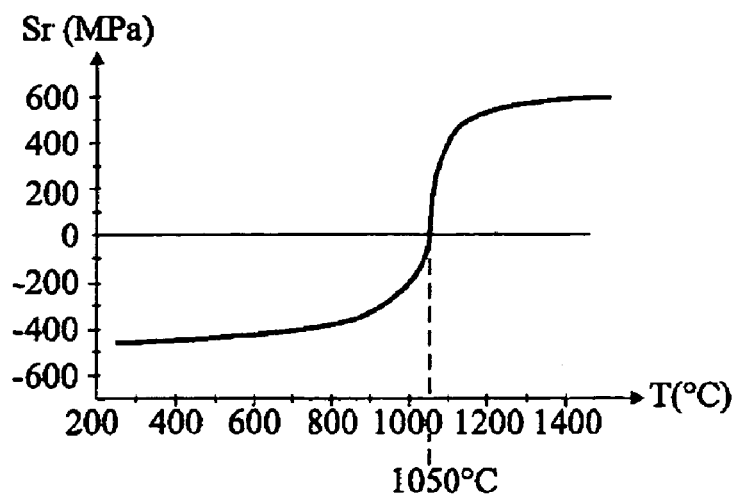

This application is the national stage application under 35 U.S.C. §371 of the International Application No. PCT/FR2004/001091 and claims the benefit of French Application No. 03/05453, filed May 5, 2003 and Int'l Application No. PCT/FR2004/001091, filed May 5, 2004, the entire disclosures of which are incorporated herein by reference in their entireties.

The present invention relates to the growth of silicon carbide on a silicon substrate (SiC/Si).

Currently, the growth of silicon carbide on a silicon substrate is a privileged way to obtain cubic SiC layers of large dimensions. The advantages of silicon as a substrate for the growth of SiC and/or of other materials are its low cost, its availability in large dimensions, and its ability to directly form a 3C SiC layer by carburizing. The disadvantages of silicon substrates for the growth of SiC especially result from the difference between mesh parameters and the difference between thermal expansion coefficients for Si and SiC. This results in a poor crystal quality, and above all in the generation of strong residual stress when the substrate is brought down from the growth temperature to the room temperature, which results in a strong curvature of the substrate.

In fact, the crystal quality is sufficient for a large number of applications such as the forming of pressure, temperature, or flow sensors, as well as some electronic devices. However, the curvature may be so high that it makes the use of conventional photolithography techniques necessary for the industrial exploitation of these layers impossible, and this, all the more as the substrate dimension increases, while the use of silicon wafers of large diameters, currently equal to or greater than 20 cm, currently is the rule in industrial manufacturing processes.

T. Chassagne et al. have shown, in a paper published in Materials Science Forum, Vol. 353-356 (2001), pp. 155-158, that, according to the carburizing temperature of the substrate, the SiC layer may be either in compression, or in extension. They provide in the conclusion of their article to form unstressed SiC layers by a selection of this carburizing temperature. However, the curve illustrated in FIG. 2 of the above-mentioned paper and reproduced in appended FIG. 1 indicates that the transition between compression and extension occurs within a very narrow interval and it can be difficult in the context of a reproducible industrial process to select actual conditions under which the stress would be zero.

A simple method enabling growth of a silicon carbide layer on a silicon substrate by avoiding or significantly decreasing the curvature of the obtained structure is not always available.

An object of the present invention is to provide such a method.

The present invention also aims at a structure comprising a silicon carbide layer on a silicon substrate exhibiting no curvature or at least a sufficiently slight curvature to be compatible with current technological possibilities.

To achieve these objects, the present invention provides a method for forming a silicon carbide layer on a silicon wafer, comprising the steps of depositing an anti-carburizing mask on the wafer according to a substantially tablecloth pattern; performing a carburizing step in conditions such that the residual stress is of extension type, respectively of compression type; eliminating the mask; and performing a carburizing step in conditions such that the residual stress is of compression type, respectively of extension type.

According to an embodiment of the present invention, the method further comprises, after the carburizing steps, a step of epitaxial growth of a silicon carbide layer.

According to an embodiment of the present invention, one of the carburizing steps is performed at a temperature lower than 1000° C. and the other carburizing step is performed at a temperature higher than 1100° C.

According to an embodiment of the present invention, one of the carburizing steps is performed at a temperature lower than 950° C. and the other carburizing step is performed at a temperature higher than 1150° C.

According to an embodiment of the present invention, at least the first carburizing step is performed to saturate with carbon the upper surface of the carburized areas.

According to an embodiment of the present invention, the mask is formed of silicon oxide.

The present invention also provides a silicon wafer covered with silicon carbide on which alternate areas in which the residual stress between the silicon carbide and the silicon is residual compression stress and areas in which the residual stress between the silicon carbide and the silicon is extension stress.

According to an embodiment of the present invention, the alternated areas are arranged according to a substantially tablecloth pattern.

According to an embodiment of the present invention, the stress exhibits an anisotropy and the alternated areas are asymmetrical.

The foregoing and other objects, features, and advantages of the present invention will be discussed in detail in the following non-limiting description of specific embodiments in connection with the accompanying drawings, among which:

FIG. 1 shows the residual stress versus the carburizing temperature such as published in the above-mentioned paper of T. Chassagne et al.; and FIGS. 2A to 2D illustrate successive steps of a method according to the present invention.

Generally, the present invention provides sharing the surface of a silicon substrate in two types of areas. On one type of area, the carburizing will be performed according to a method causing residual compression stress, and on the other type of area, according to a method causing residual extension stress. "Residual stress" is here used to designate the stress appearing when the substrate is brought down from the growth temperature to room temperature.

The surface of an area must be small as compared with the substrate surface so that the average residual stress is homogeneous over the entire substrate. The surface and the shape of the areas of each type are determined so that the total extension stress of the areas in extension is counterbalanced by the total compression stress of the areas in compression. The absolute value of the extension stress is generally quite close to the absolute value of the compression stress, whereby with a substrate prepared to obtain a tablecloth distribution of squares in compression alternating with squares in extension of same surface area, satisfactory results can be obtained. If the stress is different, a deformed tablecloth structure in which the squares of a first type will be completely separated from one another by a continuous background of the other type may be provided.

In the case of an anisotropy of significant curvature, for example, if the substrate is disoriented with respect to a low-index crystal plane, the elementary areas, or the areas of one of the two types, may advantageously be square, rectangular, circular, or oval-shaped to compensate for the stress in each direction.

The dimensions of the elementary areas may be adapted to those of the components for which the structure has been formed to take the best advantage thereof. The component may possibly take advantage of the presence of the two types of stress at the level of its active portion and/or at that of its passive portion, for example, a portion of an active area in tension surrounded with a passive area portion in compression, which either balances the stress of the active area, or is used as a support for electric circuit tracks. This may result in more complex shapes, possibly with concentric elementary areas.

FIGS. 2A to 2D are simplified cross-section views illustrating successive steps of implementation of the present invention.

Figure 2A:
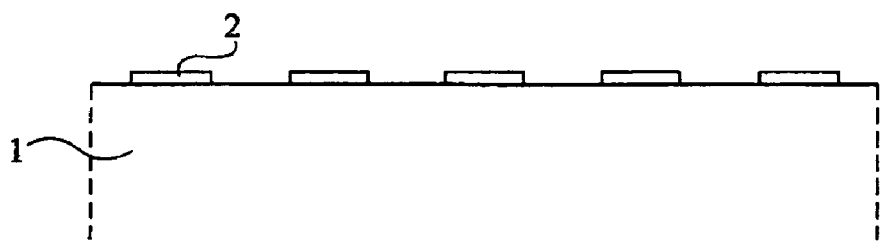

As illustrated in FIG. 2A, it is started from a silicon substrate 1 covered with a mask 2 having a tablecloth or tablecloth-like configuration, as described previously.

Figure 2B:
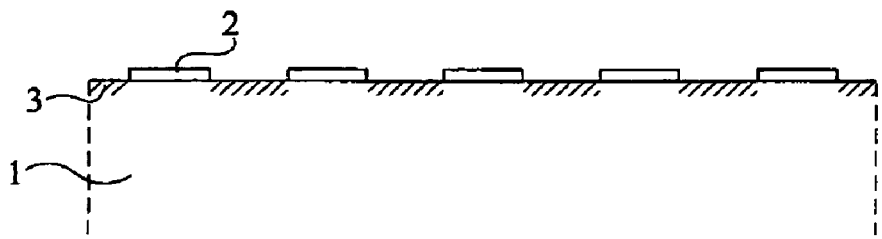

Then, as illustrated in FIG. 2B, the substrate is carburized to obtain carburized areas 3 in the regions uncovered by mask 2. Mask 2 may for example be formed of a thin $SiO_2$ layer, of a thickness of approximately 100 nm, or of any other material, such as $Si_3N_4$, likely to prevent the areas that it covers from being carburized.

For this carburizing step, temperature ranges such that the residual stress that would be caused on cooling of the substrate in case of the deposition of a homogeneous layer causes residual stress by compression or by extension will be selected. If the conditions indicated in the above-mentioned paper are selected, a temperature range much greater or much smaller than 1050° C. will be selected. A temperature for example under 1000° C. and preferably under 950° C., or above 1100° C. and preferably above 1150° C., will be selected. It should be noted that other types of conditions may be selected and that what matters is to be clearly on one side or the other of the limiting conditions in which the carburizing causes residual stress in compression or in extension.

Figure 2C:
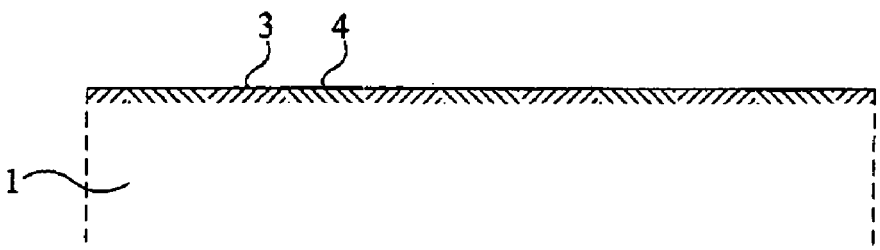

Then, as illustrated in FIG. 2C, mask 2 is eliminated and a new carburizing step is performed on the other side of the above-mentioned limiting conditions, that is, if regions 3 result from a carburizing causing residual compression/extension stress, the carburizing of areas 4 will cause residual stress of extension/compression type.

If the first carburizing step has been carried out in conditions such that there is a carbon saturation at the surface, in the next carburizing step, the already-carburized areas are not affected.

Figure 2D:
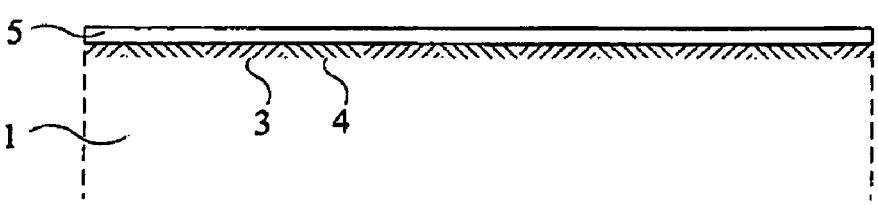

Then, as illustrated in FIG. 2D, an epitaxial growth of a silicon carbide layer 5 is preferably performed, so that the total thickness of the silicon carbide layer comprising the carburized areas and the epitaxial layer has a desired value. Conventionally, this epitaxy is performed at a temperature greater than 1150° C. However, this epitaxy will develop with the same characteristics for SiC as those of the underlying regions, that is, the portion of the epitaxial layer formed under the carburized areas causing residual stress in extension will cause residual stress in extension and the portions of the epitaxial layer formed above the carburized areas causing residual stress in compression will also cause residual stress in compression.

The layer and the substrate are then ready to be used to manufacture components. An epitaxial layer of an element III nitride may in particular be formed on the silicon carbide.

Of course, the present invention is likely to have various alterations and modifications which will occur to those skilled in the art. In particular, those skilled in the art may select the distribution of the areas of various types and the carburizing and epitaxy conditions.

The invention claimed is:

1. A method for forming a silicon carbide layer on a silicon wafer, said method comprising the steps of:
   depositing an anti-carburizing mask on the wafer according to a substantially tablecloth pattern providing alternating masked first and unmasked second areas;
   performing a first carburizing step in conditions such that the residual stress of said unmasked second areas is either an extension stress or a compression stress;
   eliminating the mask, thereby unmasking said previously masked first areas;
   performing a second carburizing step in conditions such that the residual stress of said previously masked first areas is a compression stress when said residual stress of said unmasked second areas is an extension stress, and is an extension stress when said residual stress of said unmasked second areas is a compression stress.

2. The method of claim 1, further comprising after the first and second carburizing steps, a step of epitaxial growth of a silicon carbide layer.

3. The method of claim 1, wherein one of the first and second carburizing steps is performed at a temperature lower than 1000° C. and the other of the first and second carburizing steps is performed at a temperature higher than 1100° C.

4. The method of claim 1, wherein one of the first and second carburizing steps is performed at a temperature lower than 950° C. and the other of the first and second carburizing steps is performed at a temperature higher than 1150° C.

5. The method of claim 1, wherein at least the first carburizing step is performed to saturate with carbon the upper surface of the carburized areas.

6. The method of claim 1, wherein the mask is formed of silicon oxide.

* * * * *